(12) United States Patent
Hassel et al.

(10) Patent No.: US 9,335,227 B2
(45) Date of Patent: May 10, 2016

(54) DEVICE FOR DETERMINING TORQUE AND ASSOCIATED MEASURING METHOD

(75) Inventors: Jörg Hassel, Erlangen (DE); Gotthard Rieger, München (DE); Roland Weiss, Erlangen (DE); Hermann-Josef Wiegand, Rasdorf (DE)

(73) Assignee: Siemens Aktiengesellschaft, München (DE)

( * ) Notice: Subject to any disclaimer, the term of this patent is extended or adjusted under 35 U.S.C. 154(b) by 62 days.

(21) Appl. No.: 14/239,016

(22) PCT Filed: Aug. 18, 2011

(86) PCT No.: PCT/EP2011/064227
§ 371 (c)(1),
(2), (4) Date: Mar. 13, 2014

(87) PCT Pub. No.: WO2013/023699
PCT Pub. Date: Feb. 21, 2013

(65) Prior Publication Data
US 2014/0174203 A1 Jun. 26, 2014

(51) Int. Cl.
*G01L 3/10* (2006.01)
*G01R 33/09* (2006.01)

(52) U.S. Cl.
CPC ............... *G01L 3/102* (2013.01); *G01L 3/103* (2013.01); *G01R 33/093* (2013.01)

(58) Field of Classification Search
CPC .... G01R 33/093; G01R 33/09; G01R 33/091; G01R 13/02; G01R 13/0227; G01L 3/102; G01L 3/103; G01L 3/10; G01L 3/101; H01L 41/20; H01L 43/10; H01L 43/08; H01L 43/00

USPC ....................... 73/862.333, 862.335
See application file for complete search history.

(56) References Cited

U.S. PATENT DOCUMENTS 4,801,830 A * 1/1989 Ogino et al. ................ 310/68 B
6,325,914 B1 * 12/2001 Dediu et al. ................... 205/688
(Continued)

FOREIGN PATENT DOCUMENTS

CN 101427395 5/2009
DE 102006019482 A1 10/2007
(Continued)

OTHER PUBLICATIONS

Office Action issued Sep. 23, 2014 in corresponding Chinese Patent Application No. 201180072919.6.
(Continued)

*Primary Examiner* — Lisa Caputo
*Assistant Examiner* — Philip Cotey
(74) *Attorney, Agent, or Firm* — Henry M. Feiereisen LLC

(57) ABSTRACT

Torque transmitted via a drive shaft of a motor is contactlessly determined using organic magnetoresistive semiconductor element, unlike known torque sensors that can generate greatly fluctuating measurement signals even at a constant torque. The organic magnetoresistive semiconductor element is mounted on a drive shaft or a coupling thereof. For this purpose, a field generator is provided, which is rigidly connected to the drive shaft or the clutch and which in the environment of the drive shaft generates a magnetic field that is dependent upon the torque. In the environment, the OMR semiconductor element is arranged to be stationary. The OMR semiconductor element has two electrodes between which a voltage source generates an electrical voltage.

10 Claims, 3 Drawing Sheets

(56) References Cited

U.S. PATENT DOCUMENTS

| | | | |
|---|---|---|---|
| 2002/0020229 A1* | 2/2002 | Nakamura et al. | 73/862.333 |
| 2004/0194559 A1* | 10/2004 | Nakamura et al. | 73/862.331 |
| 2005/0179101 A1* | 8/2005 | Tanaka et al. | 257/421 |
| 2006/0091991 A1 | 5/2006 | Wohlgenannt et al. | |
| 2014/0191766 A1* | 7/2014 | Hassel et al. | 324/537 |

FOREIGN PATENT DOCUMENTS

| | | | |
|---|---|---|---|
| DE | 102007003382 A1 | 7/2008 | |
| EP | 1 167 936 A2 | 1/2002 | |
| JP | 5-340826 | 12/1993 | |

OTHER PUBLICATIONS

International Search Report for PCT/EP2011/064227; mailed May 21, 2012.

Japanese Abstract of Publication No. 05340826 A published Dec. 24, 1993.

Office Action dated May 15, 2015 in corresponding Chinese Patent Application No. 201180072919.6.

* cited by examiner

DEVICE FOR DETERMINING TORQUE AND ASSOCIATED MEASURING METHOD

CROSS REFERENCE TO RELATED APPLICATIONS

This application is the U.S. national stage of International Application No. PCT/EP2011/064227, filed Aug. 18, 2011 and claims the benefit thereof. The international application is incorporated by reference herein in its entirety.

BACKGROUND

Described below is a device for determining a torque which acts on a drive shaft. The drive shaft can be, for example, a shaft between a motor and a working machine, via which a torque from the motor is transmitted to the drive machine. Also described is a method for determining the torque.

The registration of a torque on a shaft or on a coupling for such a shaft is applied in industrial drive technology, in power technology, in web drives and in automobile technology. In one embodiment of torque sensors, the determination of the torque is carried out without contact. Here, a signal correlated with a direction or magnitude of the torque is transferred from the rotating parts (shaft or coupling) to a fixed sensor, for example via an air gap. Thus, no wearing parts, such as wiping contacts, for example, have to be used. This considerably increases the reliability of the sensors.

A signal correlated with the transmitted torque can be generated by a magnetic device which is fixed to the shaft and which generates a magnetic field. This magnetic field is measured by a magnetic field sensor arranged in a stationary manner in the vicinity of the shaft and is processed further by suitable electronics. The magnetic field sensors used are Hall sensors or sensors which are based on the AMR effect (anisotropic magnetoresistive effect). The disadvantage with a magnetic field-based torque sensor is that the magnetic field sensors used generate highly fluctuating signals even in the case of a constant torque. Therefore, a relatively high expenditure on switching is necessary in order to determine a torque with a magnetic field-based torque sensor reliably.

SUMMARY

Described below is a device used to determine a torque on a drive shaft or on a coupling of the same.

In the device, use is made of an organic magnetoresistive semiconductor element (OMR semiconductor element), in order to determine the torque on a drive shaft or on the coupling without contact. An OMR semiconductor element is based on an organic semiconductor and changes its electrical resistance as a function of a magnetic field when the latter penetrates the OMR semiconductor element.

In order to register the torque, the device has a field generating device which is firmly connected to the drive shaft or a coupling of the same and which, in the surroundings of the drive shaft, generates a magnetic field that depends on the torque (the direction and/or magnitude of the latter). In the surroundings in which the field is generated, the OMR semiconductor element is arranged in a stationary manner. The OMR semiconductor element has two electrodes, between which a voltage source of the device generates an electric current or an electric voltage.

By using the device, the torque can be determined in the following way in accordance with the method. Using the field generating device, a magnetic field is generated on the drive shaft (or possibly on the coupling) as a function of the torque. This field is detected in the surroundings of the drive shaft by the OMR semiconductor element. This makes it possible, by the OMR semiconductor element, to set an electric variable as a function of the detected magnetic field. This electric variable can be, for example, a current flowing between the electrodes. A constant-current or constant-voltage measurement may be made possible by the voltage source.

The device and the method have the advantage that a measured signal determined thereby for the torque exhibits only relatively small fluctuations, which are not caused by a torque change. In addition, on the basis thereof, it is possible to produce a torque sensor with little effort and low costs.

The OMR semiconductor element can be formed as a layer which surrounds the drive shaft and/or the coupling, at least in some regions. In this way, by the OMR semiconductor element, as compared with detection using a Hall sensor or an AMR sensor, the magnetic field is not detected in point form, so to speak, but relatively over a large area. During the measurement of the torque, this results in averaging effects, which ensure a low-fluctuation measured signal. An embodiment of the device has an OMR semiconductor element which has the shape of a hollow cylinder. This hollow-cylindrical OMR semiconductor element surrounds the drive shaft in the circumferential direction of the drive shaft, so that fluctuation of the measured signal, such as could be caused by a rotation of the drive shaft, is effectively suppressed. An OMR semiconductor element in the shape of a segment of a hollow cylinder can prove to be likewise beneficial, since the element can be removed from the surroundings of the drive shaft with little effort (for example for repair purposes). In addition, it is also possible to form it, for example, as a shaft protector.

A further advantage results if the OMR semiconductor element is arranged on a flexible substrate. This allows a very simple, space-saving structure of a housing of the device and permits simple, economical mounting of the torque sensor system.

Another development of the device provides a measuring device for measuring a variable which is proportional to a current flowing through the OMR semiconductor element and/or to a voltage present on the OMR semiconductor element. This variable can be, for example, the current or the voltage itself or an electric voltage which is dropped across a further element through which the same current flows as through the OMR semiconductor element. On the basis of a measured signal for the variable, automated monitoring of the torque can advantageously be provided or a control signal for an indicator can be formed.

A particularly good measuring effect for the torque results if the OMR semiconductor element is operated with a constant voltage within an operating range in which the OMR semiconductor element exhibits a maximum field sensitivity. Accordingly, an advantageous development of the device provides for the voltage source to be designed as a constant-voltage source. The field sensitivity in this case indicates the change dR in the electrical resistance of the OMR semiconductor element relative to a change in the magnetic field strength dH, i.e. dR/dH.

According to another advantageous development of the device, an OLED, which means an organic light-emitting diode, is formed by the OMR semiconductor element. This can be achieved by an appropriate selection of the organic semiconductor material used for the production of the OMR semiconductor element. By an OLED, in a manner that can be implemented simply, a visual display of the torque transmitted by the shaft is made possible. For example, it is possible to achieve the situation where a region of the shaft in which a high torque acts appears to be brighter than a less loaded region.

Another advantageous type of optical torque indication is provided if the electric voltage which is generated between the electrodes of the OLED is set to a value at which the OLED only illuminates if the torque satisfies a predetermined criterion. Thus, by appropriate pre-definition of the criterion, it is possible for example to indicate whether a specific minimum torque is being transmitted or whether a maximum permissible torque is being exceeded, for instance.

In another advantageous development of the device, the device has at least two OMR semiconductor elements which are each configured in one of the ways already described. In this development, the OMR semiconductor elements can have different characteristic curves, so that they exhibit different magnetoresistive properties. Additionally or alternatively, electric voltages of different magnitudes are generated between the respective electrodes of the OMR semiconductor elements during operation of the device. Providing a plurality of OMR semiconductor elements results in the advantage that the maximum field sensitivity in each OMR semiconductor element can be provided for a different absolute magnetic field strength. This enables accurate measurement of the torque over a greater torque range.

In conjunction with the provision of a plurality of OMR semiconductor elements, which each also form an OLED, a further advantage results if the OLEDs have different illumination limits in relation to the torque. In this case, an illumination limit is to be understood to mean that magnetic field strength at which, when exceeded, the respective OLED illuminates. By such an arrangement, limits for torque ranges can be predefined. In relation to the individual torque ranges, the correspondingly illuminating OLEDs then indicate in which of the ranges a current torque currently lies. Using an appropriately high number of OLEDs, it is even possible for a virtually continuous visual indication of the torque on the drive shaft or the coupling to be provided.

In conjunction with generating the magnetic field on the drive shaft or coupling, an embodiment of the device provides for the field generating device to have two magnetic elements, of which the relative position to each other depends on the torque. In this case, it is conceivable for a magnet, as a first magnetic element, to be covered by a second, soft-magnetic element, which shields the magnet with respect to the surroundings of the drive shaft. By an appropriate mechanism, the soft-magnetic element can then be displaced as a function of the torque, so that part of the field from the magnet reaches the surroundings.

In an embodiment of the device, the field generating device includes an element which generates the magnetic field by inverse magnetostriction as a function of a change in its shape which is caused by the torque. This embodiment has the advantage that no mechanical arrangement that is susceptible to faults is needed to generate a variable magnetic field.

Also described below are developments of the device and the method.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
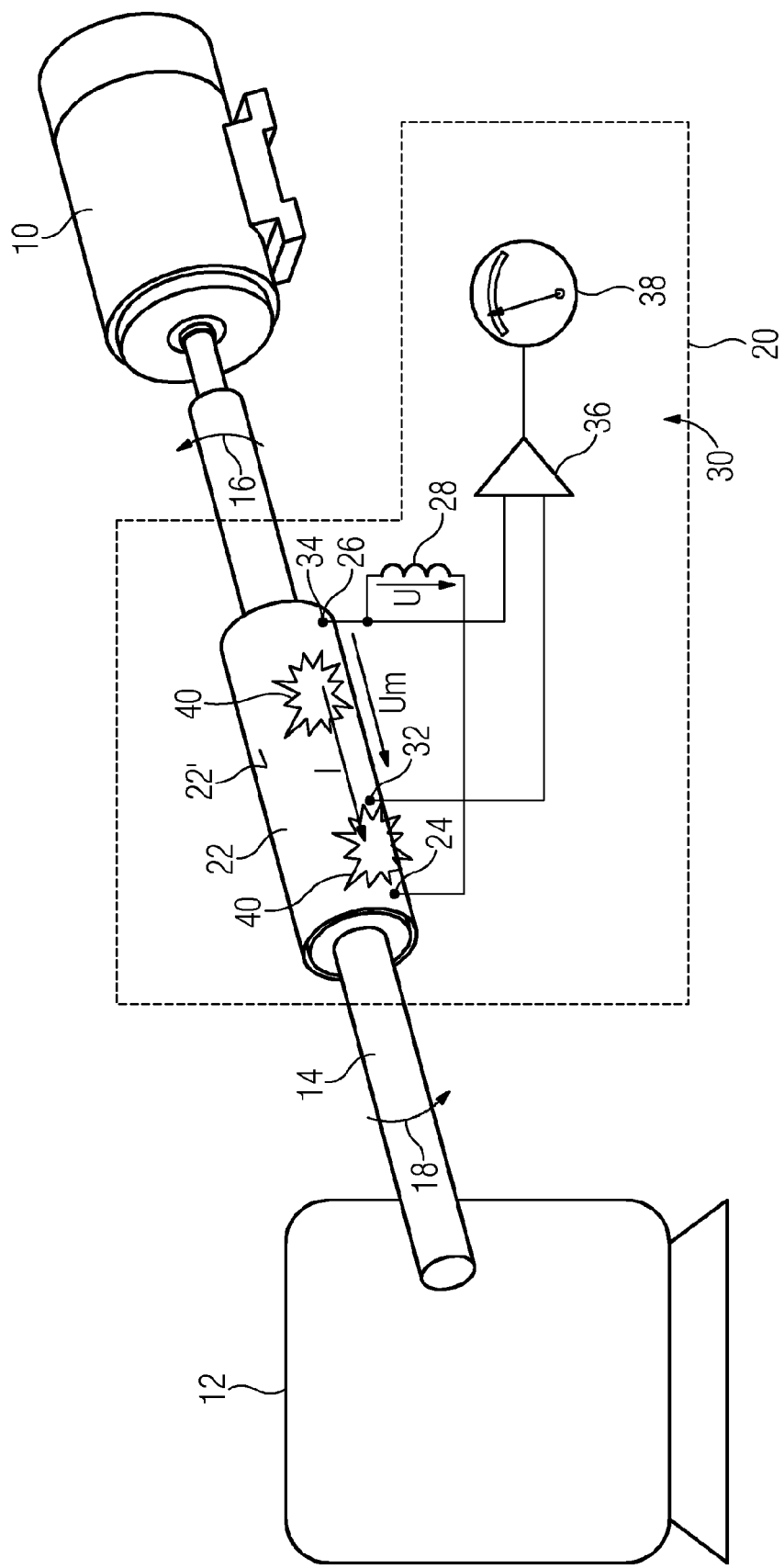
FIG. 1 is a schematic, partially perspective, illustration of a torque sensor according to one embodiment of the device.

Reference will now be made in detail to the preferred embodiments, examples of which are illustrated in the accompanying drawings, wherein like reference numerals refer to like elements throughout.

FIG. 1 shows a motor 10 and a working machine 12. The working machine 12 can be, for example, a milling machine or a conveyor belt. The working machine 12 is driven by the motor 10. For this purpose, the motor 10 is coupled to the working machine 12 via a shaft 14, via which the motor 10 transmits a motor torque 16 to a coupling (not specifically illustrated) of the working machine 12. The shaft 14 rotates about its longitudinal axis. At the coupling, a load torque 18 from the working machine 12 acts on the shaft 14.

During an operation of the working machine 12, it is intended to determine how high the torque transmitted from the motor 10 via the shaft 14 to the working machine 12 is. For this purpose, a torsional force acting on the shaft 14 is measured by using a torque sensor 20 on the shaft 14. The torsional force results from the motor torque 16 and the load torque 18 acting against the latter. From the torsional force determined, it is possible to draw conclusions about the torque transmitted.

The torque sensor 20 is one embodiment of the device. The measurement is carried out without contact. For this purpose, the shaft 14 is arranged concentrically in a sleeve 22. The sleeve 22 does not touch the shaft 14, so that the shaft 14 can rotate in the sleeve 22. The sleeve 22 is firmly connected to a base (not illustrated) and does not co-rotate with the shaft 14.

The sleeve 22 has a layer 22' of an organic semiconductor material, in which an electrical resistance depends on a field strength of a magnetic field penetrating the semiconductor material (magnetoresistive effect). The magnetic field is generated by a magnetic coating, which is a constituent part of the shaft 14 and which, during operation of the sleeve 22, is located on or in a steel rod of the shaft 14. The coating is firmly connected to the rod such that the shape thereof changes together with that of the rod when the torsional force to be measured acts on the latter. The magnetic coating includes a magnetic material which generates a magnetic stray field around the shaft 14 or at the ends of the coating, the field strength of the field depending on the shape of a body formed by the coating (inverse magnetostriction). This magnetic field penetrates the sleeve 22. A field strength of the magnetic field is greater, the greater the torsional force that acts on the shaft 14.

Figure 2:
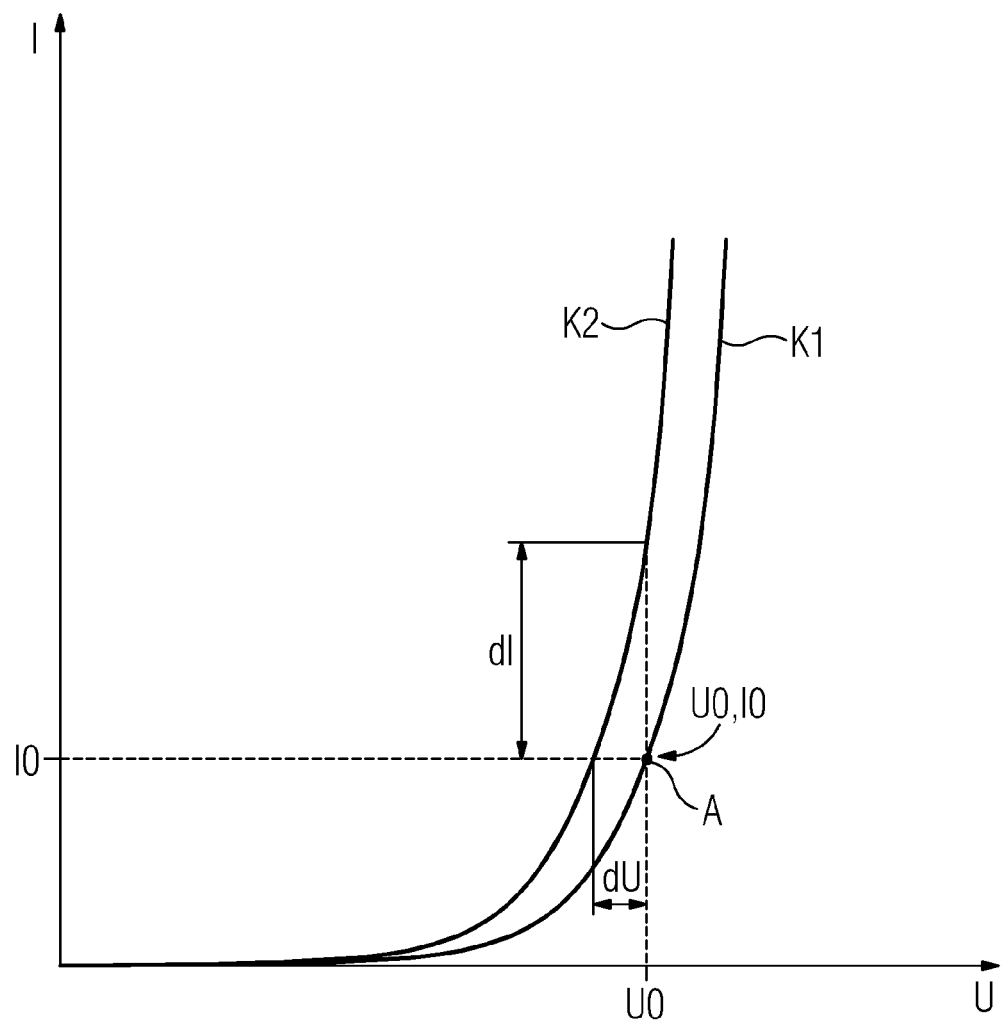
FIG. 2 is graph of a basic course of characteristic curves of an OMR sensor and an OLED, respectively.

By using FIG. 1 and FIG. 2, the following text explains how the torque transmitted via the shaft 14, i.e. the torsional force acting on the shaft 14, is determined.

The layer 22' of the organic semiconductor material located on the sleeve 22 is connected electrically to a voltage source 28 via two electrodes 24, 26. The voltage source 28 generates an electric voltage U having the voltage value U0 between the electrodes 24, 26. For the case in which no torsional force acts on the shaft 14, an electric current I having the current intensity I0 flows through the layer 22' as a result. This corresponds to a working point A on a U/I characteristic curve K1 of the organic semiconductor material. A characteristic curve K2 results if the organic semiconductor material is penetrated by a magnetic field having a specific, higher field strength. In this way, for the case in which the voltage source 28 generates a constant voltage U with the voltage value U0, the current I rises by a current intensity value dI. If, on the other hand, a constant current I with the current intensity I0 is generated by the voltage source 28, then the voltage U decreases by a voltage value dU.

If the voltage source 28 used is a constant-voltage source, it is possible, for the quantitative measurement of the magnetic field, to obtain a current increase dI of about ten to thirty per cent relative to I0 by the arrangement shown in FIG. 1. This permits a very accurate measurement of the change in the magnetic field strength.

Using a measuring circuit 30, a voltage Um on the layer 22' is measured between two measuring electrodes 32, 34 of the measuring circuit 30. The voltage Um is caused by the current I. The measured voltage Um is amplified electronically by an amplifier 36 of the measuring circuit 30. The signal amplified in this way is transmitted to an indicating device 38 of the measuring circuit 30 which, on the basis of the signal, determines and indicates the torsional force acting on the shaft 14 and therefore the torque transmitted via the shaft 14. The values of the voltage Um and therefore also the amplified signal exhibit only slight fluctuations in the case of a constant torque. Since the sleeve 22 and therefore also the layer 22' surround the shaft 14 completely in the circumferential direction, any asymmetry of the magnetic field which, because of the rotation of the shaft 14, generates a periodically fluctuating field strength in each point of the sleeve 22, does not act on the voltage Um, as a result of an averaging effect in the layer 22'. In the case of a Hall sensor, which cannot be configured so flatly as the organic semiconductor element and which therefore detects the magnetic field only at a point, the rotation of the shaft 14 would cause a fluctuating signal.

The current I and the voltage Um are electric variables which are varied as a function of the magnetic field by the magnetoresistive effect of the layer 22'.

Instead of the voltage Um, a measured current can also be measured by the measuring circuit 30.

The organic semiconductor material of the layer 22' represents an OLED which illuminates when the current intensity of the current I flowing through the same exceeds a specific current intensity value. The voltage U of the voltage source 28 is set in such a way that the illuminating effect begins when the torque acting on the shaft 14 is greater than a maximum permissible torque. In this way, an operator of the working machine 12 is then shown immediately by luminescent regions 40 of the layer 22' that the motor 12, the working machine 12 or the shaft 14 is overloaded.

To form the layer 22', the organic semiconductor material has been applied to a flexible substrate. This can be, for example, polyethylene (PET) or a polyimide, such as can be obtained, for example, under the description Kapton.

Figure 3:
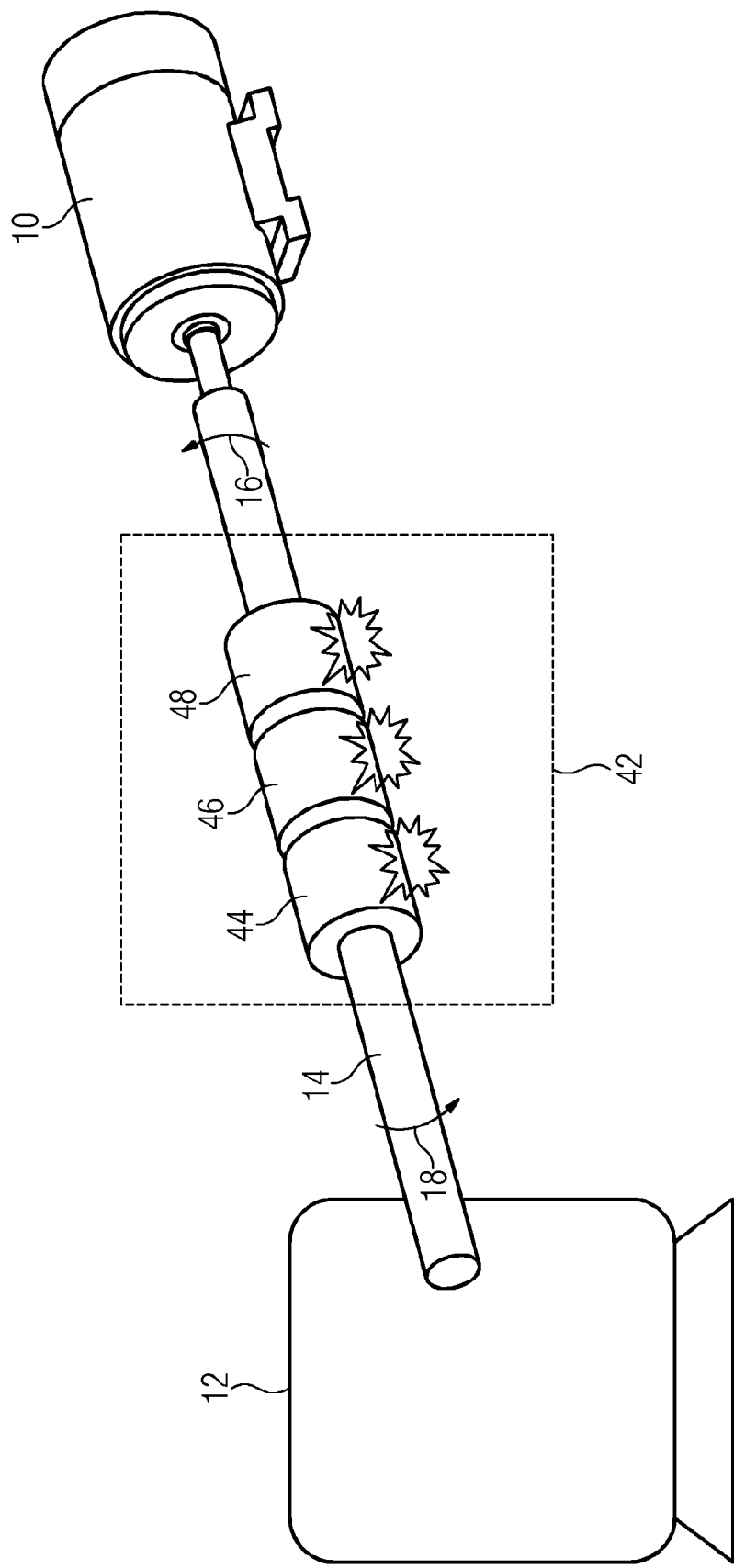
FIG. 3 is a schematic, partially perspective, illustration of a torque sensor according to a further embodiment of the device.

FIG. 3 shows a further arrangement with a motor 10, a working machine 12 and a shaft 14. In FIG. 3, elements which, in their function, correspond to elements shown in FIG. 1, are provided with the same designations as in FIG. 1.

In the example shown in FIG. 3, a torque sensor 42 has three rings 44, 46, 48, each of which has a layer of an organic semiconductor material, by which an OLED is formed. The torque sensor 42 is an embodiment of the device. In each of the three layers there flows a current which is generated by a voltage source (not illustrated) in a similar way to that which has already been explained in conjunction with FIG. 1. The three rings 44, 46, 48 are penetrated by a magnetic field, which is generated by the shaft 14 in the manner already described.

Each of the rings 44, 46, 48 has a different illumination limit: if, via the shaft 14, a torque is transmitted which is greater than a predetermined minimum torque, then the ring 48 illuminates, while the other rings 44, 46 initially remain dark. Only when the torque exceeds a lower limit of a normal or else working torque range does the ring 46 also illuminate. If a predetermined maximum permissible or else overload torque is exceeded, the ring 44 also illuminates. If the overload torque is exceeded repeatedly and only briefly as a result of step changes in load, then the ring 44 flashes. Through this signaling, dynamic load peaks can be detected by an operator.

The torque sensors described can also be arranged on a coupling instead of a shaft. Furthermore, they can be used to determine a torque which is transmitted via a shaft to a generator.

The examples show how, by the flat and continuous coating of a sleeve or of a ring, each of which can be made of a flexible material, a structurally advantageous measurement of the torque is made possible. In addition, the torques on the shaft can be visualized by the illuminating effect.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A device for determining a torque acting on a drive shaft, comprising:
    a field generating device forming a constituent part of one of the drive shaft and a coupling of the drive shaft and generating around the drive shaft a magnetic field in dependence upon the torque;
    an organic magnetoresistive semiconductor element having two electrodes and forming an organic light-emitting diode, disposed in a stationary manner in an effectively cylindrical layer forming a hollow shape in the magnetic field around the drive shaft; and
    a voltage source generating an electric voltage between the two electrodes of the organic magnetoresistive semiconductor element.

2. The device as claimed in claim 1, wherein the organic magnetoresistive semiconductor element is formed as a layer in a hollow cylinder shape surrounding at least a portion of at least one of the drive shaft and the coupling.

3. The device as claimed in claim 2, wherein the organic magnetoresistive semiconductor element is formed on a flexible substrate.

4. The device as claimed in claim 3, further comprising a measuring device measuring at least one of a variable proportional to a current flowing through the organic magnetoresistive semiconductor element and a voltage on the organic magnetoresistive semiconductor element.

5. The device as claimed in claim 4, wherein the voltage source is a constant-voltage source.

6. The device as claimed in claim 5, wherein the electric voltage causes the organic light-emitting diode to illuminate only if the torque satisfies a predetermined criterion.

7. The device as claimed in claim 6,
    further comprising at least one additional organic magnetoresistive semiconductor element, and
    wherein the at least one additional organic magnetoresistive semiconductor element has a different characteristic curve, than the organic magnetoresistive semiconductor element, describing a magnetoresistive property, and/or during operation of the device, the voltage source generates voltages of different magnitudes between the two electrodes of the organic magnetoresistive semiconductor element and two electrodes of the at least one additional organic magnetoresistive semiconductor element.

8. The device as claimed in claim 7, wherein the at least one additional organic magnetoresistive semiconductor element forms another organic light-emitting diode with a different illumination limit in relation to the torque than the organic light-emitting diode formed by the organic magnetoresistive semiconductor element.

9. The device as claimed in claim 8, wherein the field generating device comprises an element which generates the magnetic field by inverse magnetostriction as a function of a change in shape caused by change in the torque.

10. A method for determining a torque transmitted via a drive shaft, comprising:
   generating a magnetic field on the drive shaft or on a coupling of the drive shaft as a function of the torque;
      detecting a magnetic field around the drive shaft by an organic magnetoresistive semiconductor element forming an organic light-emitting diode and disposed in an effectively cylindrical layer forming a hollow shape in the magnetic field around the drive shaft;
      setting an electric variable as a function of the magnetic field detected by the magnetoresistive semiconductor element; and
   visually displaying, by the organic light-emitting diode, the torque transmitted by the shaft.

* * * * *